(12) United States Patent
Miks et al.

(10) Patent No.: US 8,018,072 B1
(45) Date of Patent: Sep. 13, 2011

(54) SEMICONDUCTOR PACKAGE HAVING A HEAT SPREADER WITH AN EXPOSED EXTERION SURFACE AND A TOP MOLD GATE

(75) Inventors: Jeffrey A. Miks, Chandler, AZ (US); Jui Min Lim, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 317 days.

(21) Appl. No.: 12/342,386

(22) Filed: Dec. 23, 2008

(51) Int. Cl.
*H01L 23/433* (2006.01)
*H01L 23/48* (2006.01)
*H01L 23/34* (2006.01)

(52) U.S. Cl. .............. 257/777; 257/E23.092; 257/667; 257/723; 257/686; 257/685; 257/712; 257/675; 257/710; 257/704; 257/680; 257/774; 257/773; 257/676; 257/713; 257/727; 257/720; 257/707; 257/691; 257/787; 257/796; 257/684; 257/718; 257/778; 257/719

(58) Field of Classification Search .............. 257/777, 257/723, 686, 685, 712, 675, 710, 704, 680, 257/730, 774, 773, 676, 713, 727, 720, 707, 257/706, 691, 787, 796, 684, 718, 778, 719, 257/667, E23.092
See application file for complete search history.

(56) References Cited

U.S. PATENT DOCUMENTS

| 5,977,626 | A | * | 11/1999 | Wang et al. .................. 257/707 |
| 5,982,621 | A | * | 11/1999 | Li ................................. 361/704 |
| 6,236,568 | B1 | | 5/2001 | Lai et al. |
| 6,239,486 | B1 | * | 5/2001 | Shimizu et al. .............. 257/704 |
| 6,278,182 | B1 | * | 8/2001 | Liu et al. ...................... 257/712 |
| 6,323,066 | B2 | * | 11/2001 | Lai et al. ...................... 438/122 |
| 6,433,420 | B1 | | 8/2002 | Yang et al. |

FOREIGN PATENT DOCUMENTS

JP 6-21317 1/1994

* cited by examiner

*Primary Examiner* — A Williams
(74) *Attorney, Agent, or Firm* — Weiss & Moy, P.C.; Jeffrey D. Moy

(57) ABSTRACT

A semiconductor device has a substrate. A die is attached to a first surface of the substrate. A heat sink is provided having an approximately planer member and support members extending from the planer member. The support members are attached to the first surface of the substrate to form a cavity over the die with the planer member positioned above the die. An encapsulant is provided for encapsulating the device, wherein an exterior surface of the planer member is exposed. A non-tapered opening is formed in the planer member. The encapsulant is injected through the opening to encapsulate the cavity and the encapsulant will partially fill the non-tapered opening.

18 Claims, 2 Drawing Sheets

SEMICONDUCTOR PACKAGE HAVING A HEAT SPREADER WITH AN EXPOSED EXTERIOR SURFACE AND A TOP MOLD GATE

FIELD OF THE INVENTION

This invention relates to semiconductor packages and, more specifically, to a semiconductor package having a heat spreader with a top mold gate and pathways for the enhanced dissipation of a mold compound into an interior of a mold cavity formed by the heat spreader.

BACKGROUND OF THE INVENTION

In the operation of semiconductor devices, heat is usually generated. The amount of heat generated generally affects the operation and the efficiency of the semiconductor device. Thus, it is important for the heat to be dissipated from the semiconductor device. The heat may be dissipated from the semiconductor device in a number of different manners. For example, the heat may be dissipated into the surrounding ambient atmosphere through convection. In other instances the amount of heat generated by the semiconductor device may require the use of an external cooling mechanism. An example of an external cooling mechanism is a fan that blows cooling air over an integrated circuit to carry away heat.

Presently, some semiconductor devices dissipate the heat generated by using a heat spreader. The heat spreader will absorb the heat generated from the semiconductor device and transferred the heat to the ambient atmosphere or to some external heat sink.

When a heat spreader is used in a BGA device, the BGA device cannot be pin-gate molded using a top mold gate. In pin-gate molding, the heat spreader defines a mold cavity over a die of the device. The heat spreader prevents a top mold gate from being used to encapsulate the interior of the mold cavity since the heat spreader has a solid top surface. When a heat spreader is used, the device is generally side-gate molded. In side-gate molding, a channel is formed in the substrate of the device around an interior perimeter of a mold cavity defined over the die of the device. Openings are formed on the surface of the substrate into the channel. An encapsulant is then injected into the openings which flow through the channel to fill the interior of the mold cap. The problem with side-gate molding is mold flowability issues and ensuring that the interior of the mold cap is properly encapsulated. Furthermore, side-gate molding increases the cost and complexity of the device due to the need to form the channels and openings in the substrate.

Therefore, a need existed to provide a device and method to overcome the above problem. The device and method will provide a top mold gate and pathways for the enhanced dissipation of a mold compound into the semiconductor package.

SUMMARY OF THE INVENTION

A semiconductor device has a substrate. A die is attached to a first surface of the substrate. A heat sink is provided having an approximately planer member and support members extending from the planer member. The support members are attached to the first surface of the substrate to form a cavity over the die with the planer member positioned above the die. An encapsulant is provided for encapsulating the device, wherein an exterior surface of the planer member is exposed. A non-tapered opening is formed in the planer member. The encapsulant is injected through the opening to encapsulate the cavity and the encapsulant will partially fill the non-tapered opening.

A method of forming a semiconductor device comprising: providing a substrate; attaching a die to a first surface of the substrate; forming a non-tapered opening in a planer member of a heat sink, the heat sink having support members extending down from the planer member; attaching the support members of the heat sink to a first surface of the substrate to form a cavity over the die with the planer member positioned above the die; and encapsulating the device, wherein an exterior surface of the planer member is exposed, the encapsulant injected through the opening to encapsulate the cavity, the encapsulant partially filling the non-tapered opening.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1A:
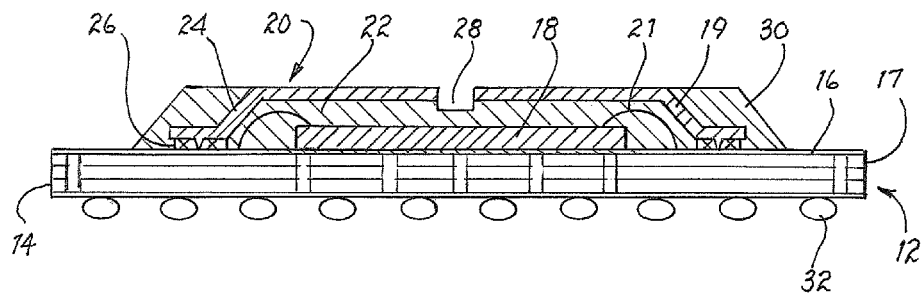
FIG. 1A is a cross-sectional side view of a semiconductor device of the present invention.
Figure 1B:
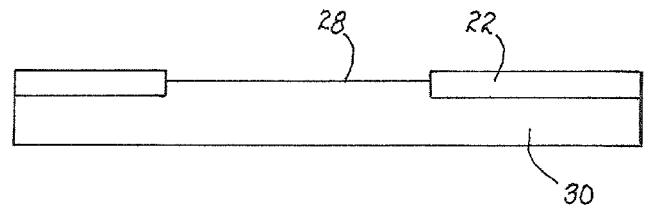
FIG. 1B is a magnified view of an opening formed in the heat spreader.

Referring now to FIGS. 1A-1B, a semiconductor device (hereinafter device 10) will be described. The device 10 has a substrate 12 having an approximately planar first surface and an approximately planar second surface opposing the first surface. The substrate 12 may be any one chosen from a conventional rigid PCB, a flexible PCB, and an equivalent thereof, but the kind of first substrate 12 is not limited herein.

The substrate 12 includes an insulation layer 14 having predetermined area and thickness. The insulation layer 14 has an approximately planar first surface and an approximately planar second surface opposing the first surface. The insulation layer 14 will have one or more metal traces 16 formed thereon. In the embodiment shown in FIG. 1, the insulation layer 14 has metal traces 16 formed on the first and second surface of the insulation layer 14. The number of metal traces 16 is not limited to the number shown in the FIG. 1. In general, the insulation layer 14 will have multiple layers of metal traces 16 formed therein. When multiple layers of metal traces 16 are formed in the insulation layer 14, a dielectric layer is generally applied between the layers of metal traces 16. The dielectric layer is used as an insulating layer to separate the layers of metal traces 16. Metal filled vias 17 may be used to mechanically and electrically connect the layers of metal traces 16. A soldermask may be placed over the top surface of the metal traces 16 to protect the metal traces 16.

A die 18 is attached to the substrate 12. The die 18 may be an RF die, a memory die, a logic die, an ASIC die, and other like elements. It should be noted that the listing of the above types of dies is given as an example and should not be seen as to limit the scope of the present invention. The die 18 will have an approximately planar first surface and an approximately planar second surface opposing the first surface. The die 18 may be coupled to the substrate 12 in a plurality of different manners. In the embodiment shown in FIG. 1, an adhesive 19 is used to couple the second surface of the die 18 to the first surface of the substrate 12. The adhesive 19 may be an adhesive film, an epoxy, or the like. The listing of the above adhesive types should not be seen as to limit the scope of the present invention. The die 18 is then electrically coupled to the substrate 12. In the present embodiment, wirebonds 21 are used to electrically couple the die 18 to the substrate 12. The wirebond 21 will form an electrical connection between a bond pad formed as part of metal trace 16 on the first surface of the substrate 12 and a bond pad formed on the first surface of the die 18. Alternatively, the die 18 may be coupled to the substrate 12 through flip chip bonding, surface mount technology (SMT) or the like.

A heat spreader 20 having a planer member 22 and support members 24 is then attached to the substrate 12 to form a cavity over the die 18. The support members 24 extend down from the planer member 22 and are attached to the first surface of the substrate 12 using an adhesive 26 so that the planer member 22 is positioned above the die 18. In the embodiment shown in FIG. 1, the heat spreader 20 is attached to the substrate 12 so as to not touch the die 18 or the wirebonds 21. The heat spreader 20 will have an opening 28 formed through the planer member 22. The opening 28 is a non-taper access hole. In accordance with one embodiment, the opening 28 is a cylindrical opening.

A mold compound 30 is generally used to encapsulate the device 10. The mold compound 30 is mainly made of non-conductive paste, non-conductive film, thermosetting plastic material or the like. During the encapsulation process, the support members 24 are encapsulated but the exterior surface of the planer member 22 remains exposed. The exterior surface of the planer member 22 is not encapsulated to allow for better heat dissipation for the device 10. In accordance with one embodiment, the entire exterior surface of the planer member 22 is not encapsulated.

The opening 28 in the heat spreader 20 allows for mold flowability through the opening 28 from outside the device 10 into the cavity formed between an interior surface of the heat spreader 20 and the die 18. Thus, during the encapsulation process, the mold compound 30 may be injected through the opening 28 for encapsulating the die 18, wirebonds 21, and exposed surfaces of the substrate 12 under the heat spreader 20. In accordance with one embodiment, the mold compound 30 will partially fill a portion of the opening 28 (FIG. 1B).

A set of contacts 32 may be coupled to the second surface of the substrate 12. In the embodiment shown in FIG. 1, the contacts 32 are solder balls. If solder balls are used, the solder balls will be electrically coupled to the second surface of the substrate 12 via bond pads. In general, a reflow process may be used to couple the solder balls to the second surface of the substrate 12. Alternative methods may be used to couple different types of contacts to the first substrate 12 without departing from the spirit and scope of the present invention.

Figure 2:
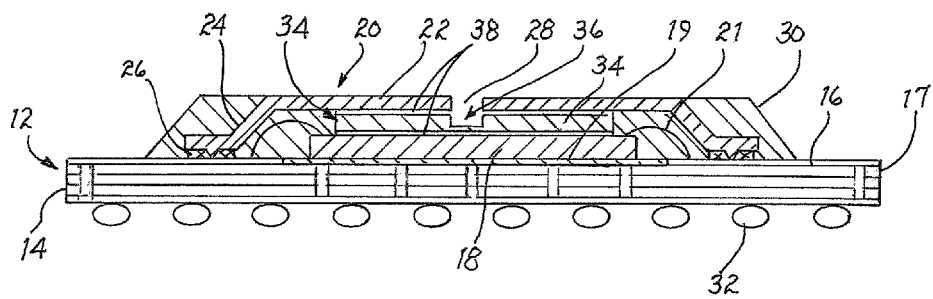
FIG. 2 is a cross-sectional side view of another embodiment of the semiconductor device of the present invention.

Referring now to FIG. 2, another embodiment of the semiconductor device 10A is shown. The device 10A has a substrate 12 having an approximately planar first surface and an approximately planar second surface opposing the first surface. The substrate 12 includes an insulation layer 14. The insulation layer 14 has an approximately planar first surface and an approximately planar second surface opposing the first surface. The insulation layer 14 will have one or more metal traces 16 formed thereon. In general, the insulation layer 14 will have multiple layers of metal traces 16 formed therein. If multiple layers of metal traces 16 are formed in the insulation layer 14, a dielectric layer is generally applied between the layers of metal traces 16. The dielectric layer is used as an insulating layer to separate the different layers of metal traces 16. Metal filled vies 17 may bee used to mechanically and electrically connect the layers of metal traces 16. A soldermask may be placed over the top surface of the metal traces 16 to protect the metal traces 16.

A die 18 is attached to the substrate 12. The die 18 will have an approximately planar first surface and an approximately planar second surface opposing the first surface. In the embodiment shown in FIG. 2, an adhesive 19 is used to couple the second surface of the die 18 to the first surface of the substrate 12. The die 18 is then electrically coupled to the substrate 12. In the present embodiment, wirebonds 21 are used to electrically couple the die 18 to the substrate 12. The wirebond 21 will form an electrical connection between a bond pad formed as part of metal trace 16 on the first surface of the substrate 12 and a bond pad formed on the first surface of the die 18. Alternatively, the die 18 may be coupled to the substrate 12 through flip chip bonding, surface mount technology (SMT) or the like.

A filler die 34 is coupled to the first surface of the die 18. The filler die 34 has an approximately planer first surface and an approximately planer second surface opposite the first surface. At least one channel 36 is formed on the first surface of the filler die 34. The second surface of the filler die 34 is coupled to the first surface of the die 18. The first surface of the filler die 34 is coupled to the interior surface of the planer member 22 of the heat spreader 20 when the heat spreader 20 is attached to the first surface of the substrate 14. In accordance with one embodiment of the present invention, a thermal interface material 38 is placed between the second surface of the filler die 34 and the first surface of the die 18 and the first surface of the filler die 34 and the interior surface of the planer member 22. The thermal interface material 38 is used to increase the thermal transfer efficiency of the device 10. The thermal interface material 38 may be a thermal paste, thermal grease or the like.

The filler die 34 is generally made of a heat-conductive material having a greater heat conductivity than the mold compound used to fill the mold cavity formed by the heat spreader 20. In accordance with one embodiment, the filler die 34 has an approximately equivalent Coefficient of Thermal Expansion (CTE) as the die 18. In the embodiment shown in FIG. 2, the filler die 34 is smaller in size than the die 18. Thus, the filler die 34 may be coupled to the first surface of the die 18 and not come into electrical contact with the bonding pads of the wirebonds 21. If the die 18 is mounted to the substrate 12 using flip chip technology, there are fewer restrictions on the size of the filler die 34.

The device 10A has a heat spreader 20. The heat spreader 20 has a planer member 22 and support members 24 extending down from the planer member 22. An opening 28 is formed through the planer member 22. The opening 28 is a non-taper access hole. In accordance with one embodiment, the opening 28 is a cylindrical opening.

The heat spreader 20 is attached to the substrate 12 and to the first surface of the filler die 34. The heat spreader 20 is attached to the substrate 12 so as to not touch the die 18 or the wirebonds 21. The support members 24 are attached to the first surface of the substrate 12 using an adhesive 26. An interior surface of the planer member 22 is attached to the first surface of the filler die 34 using the thermal interface material 38. In the embodiment shown in FIG. 2, the heat spreader 20 is attached to first surface of the filler die 34 so that the opening 28 is aligned with the channel 36 formed in the first surface of the filler die 34.

A mold compound 30 is used to encapsulate the device 10. The mold compound 30 is mainly made of non-conductive paste, film, thermosetting plastic material or the like. During the encapsulation process, the support members 24 are encapsulated but the exterior surface of the planer member 22 remains exposed. The exterior surface of the planer member 22 is not encapsulated to allow for heat dissipation of the device 10A. In accordance with one embodiment, the entire exterior surface of the planer member 22 is exposed.

The opening 28 in the heat spreader 20 and the channel 36 formed in the first surface of the filler die 34 allow for mold flowability through the opening 28 from outside the device 10, through the channel 36 and into the mold cavity, i.e., the space between the interior surface of the heat spreader 20 and the die 18. The mold compound 30 thus encapsulates the die 18, the wirebonds 21, and exposed surfaces of the substrate 12 positioned under the heat spreader 20. The mold compound 30 will generally partially fill the opening 28.

A set of contacts 32 may be coupled to the second surface of the substrate 12. In the embodiment shown in FIG. 2, the contacts 32 are solder balls. If solder balls are used, the solder balls will be electrically coupled to the second surface of the substrate 12 via bond pads. In general, a reflow process may be used to couple the solder balls to the second surface of the substrate 12. Alternative methods may be used to couple different types of contacts to the first substrate 12 without departing from the spirit and scope of the present invention.

Figure 3:
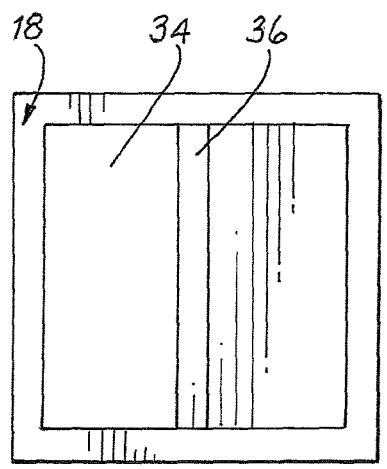
FIG. 3 is a top view of one embodiment of the filler die used in the semiconductor device of FIG. 2.

Referring now to FIG. 3, one embodiment of the first surface of the filler die 34 is shown. In the embodiment shown in FIG. 3, a single channel 36 is formed on the first surface of the filler die 34. The channel 36 run from a first end to a second end of along the first surface of the filler die 34. The channel 36 is shown to run down a central area of the first surface of the filler die 34. However, this is shown as an example and should not be seen as to limit the scope of the present invention. The opening 28 of the heat spreader 20 is aligned somewhere along the path of the channel 36.

Figure 4:
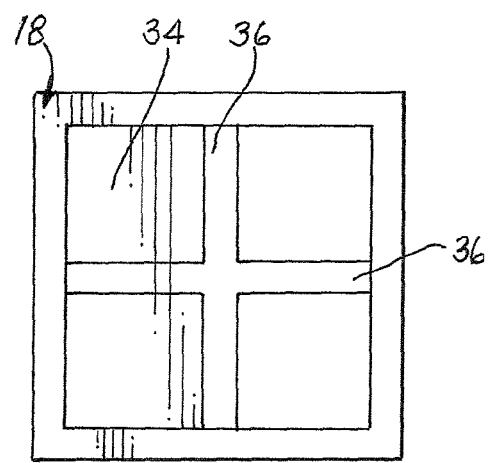
FIG. 4 is a top view of another embodiment of a filler die used in the semiconductor device of FIG. 2.

Referring now to FIG. 4, another embodiment of the first surface of the filler die 34 is shown. In the present embodiment, a pair of channels 36 is formed on the first surface of the filler die 34. Each of the pair of channels 36 run from a first end to a second end of along the first surface of the filler die 34. The pair of channels 36 intersects. In the embodiment shown in FIG. 4, the pair of channels 36 intersects in a central area of the first surface of the filler die 34. However, this is shown as an example and should not be seen as to limit the scope of the present invention. The intersection of the pair of channels 36 is where the opening 28 of the heat spreader 20 is generally aligned. However, the opening 28 may be aligned anywhere on either pair of channels 36 without departing from the spirit and scope of the present invention.

Figure 5:
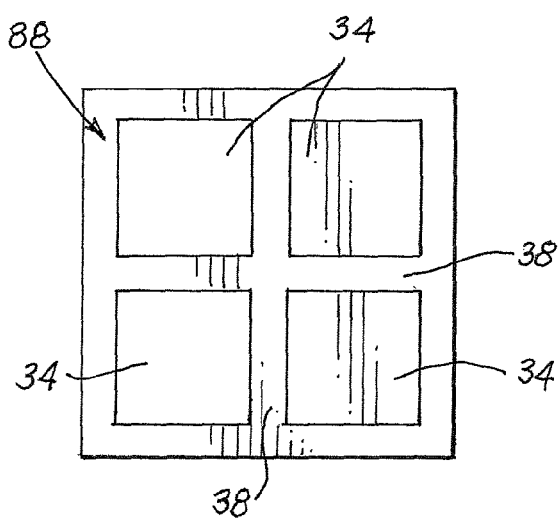
FIG. 5 is a top view of still another embodiment of the filler die used in the semiconductor device of FIG. 2.

Referring now to FIG. 5, another embodiment of the device 10A is shown. In this embodiment, a plurality of filler dies 34 is coupled to the first surface of the die 18. The plurality of filler dies 34 is arranged on the first surface of the die 18 to form one or more pathways 38. The pathways 38 are generally connected to one another. In the embodiment shown in FIG. 5, a pair of pathways 38 is formed. The pair of pathways 38 intersect in a central area of the first surface of the filler die 34. However, this is shown as an example and should not be seen as to limit the scope of the present invention.

The heat spreader 20 is attached to the first surface of the filler dies 34 so that the opening 28 is aligned with at least one of the pathways 38 formed in the first surface of the die 18. In the present embodiment, the intersection of the pair of pathways 38 is where the opening 28 is aligned. However, this is just shown as an example and the opening 28 may be aligned anywhere on any section of any pathway 38 without departing from the spirit and scope of the present invention.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor device comprising:
a substrate;
a die attached to a first surface of the substrate;
a heat sink having an approximately planer member and support members extending from the planer member, the support members attached to the first surface of the substrate to form a cavity over the die with the planer member positioned above the die;
an encapsulant for encapsulating the device, wherein an entire exterior surface of the planer member is exposed; and
a non-tapered opening formed in the planer member, the encapsulant injected through the opening to encapsulate the cavity, the encapsulant partially filling the non-tapered opening.

2. The semiconductor device in accordance with claim 1 further comprising:
a filler die having a first surface attached to the interior surface of the planer member and a second surface attached to a first surface of the die; and
at least one channel formed in the first surface of the filler die, the channel aligned with the non-tapered opening.

3. The semiconductor device in accordance with claim 2 further comprising a thermal interface material applied between the first surface of the filler die and the interior surface of the planer member and between the second surface of the filler die and the first surface of the die.

4. The semiconductor device in accordance with claim 2 further comprising a plurality of channels formed in the first surface of the filler die, the plurality of channels having an intersection, the intersection aligned with the non-tapered opening.

5. The semiconductor device in accordance with claim 2 wherein the filler die has an approximately equal Coefficient of Thermal Expansion (CTE) as the die.

6. The semiconductor device in accordance with claim 1 further comprising a plurality of contacts coupled to a second surface of the substrate.

7. The semiconductor device in accordance with claim 2 further comprising a plurality of contacts coupled to a second surface of the substrate.

8. The semiconductor device in accordance with claim 1 further comprising a plurality of filler dies having first surfaces attached to the interior surface of the planer member and second surfaces attached to a first surface of the die, the plurality of filler dies positioned on the first surface of the die to form at least one pathway in the first surface of the die, the pathway aligned with the non-tapered opening.

9. The semiconductor device in accordance with claim 8 further comprising a thermal interface material applied between the first surfaces of the filler dies and the interior surface of the planer member and between the second surfaces of the filler dies and the first surface of the die.

10. The semiconductor device in accordance with claim 1 further comprising a plurality of filler dies having first surface attached to the interior surface of the planer member and second surfaces attached to a first surface of the die, the plurality of filler dies positioned on the first surface of the die to form a plurality of pathway in the first surface of the die, the plurality of pathways having an intersection, the intersection of the pathways aligned with the non-tapered opening.

11. The semiconductor device in accordance with claim 8 further comprising a plurality of contacts coupled to a second surface of the substrate.

12. A semiconductor device comprising:
a substrate;
a die attached to a first surface of the substrate;
a heat sink having an approximately planer member and support members extending from the planer member, the support members attached to the first surface of the substrate to form a cavity over the die with the planer member positioned above the die;
an encapsulant for encapsulating the device, wherein an exterior surface of the planer member is exposed;
means formed in the planer member for injecting the encapsulant into the cavity, the encapsulant partially filling the means;
a filler die having a first surface attached to the interior surface of the planer member and a second surface attached to a first surface of the die; and
means formed in the first surface of the filler die for allowing the encapsulant to flow across the first surface of filler die, the means formed in the first surface of the filler die aligned with the means formed in the planer member.

13. The semiconductor device in accordance with claim 12 further comprising means placed between the second surface of the filler die and the first surface of the die and the first surface of the filler die and the interior surface of the planer member to increase thermal transfer efficiency.

14. The semiconductor device in accordance with claim 12 further comprising a plurality of filler dies having first surfaces attached to the interior surface of the planer member and second surfaces attached to a first surface of the die, the plurality of filler dies positioned on the first surface of the die to form at least one pathway in the first surface of the die, the pathway aligned with the means formed in the planer member.

15. The semiconductor device in accordance with claim 14 further comprising means applied between the first surfaces of the filler dies and the interior surface of the planer member and between the second surfaces of the filler dies and the first surface of the die to increase thermal transfer efficiency.

16. A semiconductor device comprising:
a substrate;
a die attached to a first surface of the substrate;
a heat sink positioned over the die and attached to the first surface of the substrate to form a cavity over the die;
an encapsulant for encapsulating the device, wherein an exterior surface of the planer member is exposed;
a non-tapered opening formed in the planer member, the encapsulant injected through the opening to encapsulate the cavity, the encapsulant partially filling the non-tapered opening;
a filler die having a first surface attached to an interior surface of the heat sink and a second surface attached to a first surface of the die; and
at least one channel formed in the first surface of the filler die, the channel aligned with the non-tapered opening.

17. The semiconductor device in accordance with claim 16 further comprising a plurality of channels formed in the first surface of the filler die, the plurality of channels having an intersection, the intersection aligned with the non-tapered opening.

18. The semiconductor device in accordance with claim 16 further comprising a plurality of filler dies having first surfaces attached to the interior surface of the planer member and second surfaces attached to a first surface of the die, the plurality of filler dies positioned on the first surface of the die to form at least one pathway in the first surface of the die, the pathway aligned with the non-tapered opening.

\* \* \* \* \*

UNITED STATES PATENT AND TRADEMARK OFFICE
CERTIFICATE OF CORRECTION

| | | |
|---|---|---|
| PATENT NO. | : 8,018,072 B1 | Page 1 of 1 |
| APPLICATION NO. | : 12/342386 | |
| DATED | : September 13, 2011 | |
| INVENTOR(S) | : Miks et al. | |

It is certified that error appears in the above-identified patent and that said Letters Patent is hereby corrected as shown below:

On the title page item (54) and col. 1, line 3, should read:

SEMICONDUCTOR PACKAGE HAVING A HEAT SPREADER WITH AN EXPOSED EXTERIOR SURFACE AND A TOP MOLD GATE

Signed and Sealed this
Twenty-fifth Day of October, 2011

David J. Kappos
*Director of the United States Patent and Trademark Office*